(12) United States Patent
Wilson

(10) Patent No.: US 7,358,146 B2
(45) Date of Patent: *Apr. 15, 2008

(54) METHOD OF FORMING A CAPACITOR

(75) Inventor: Aaron R. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 318 days.

This patent is subject to a terminal disclaimer.

(21) Appl. No.: 11/209,082

(22) Filed: Aug. 22, 2005

(65) Prior Publication Data

US 2006/0024904 A1  Feb. 2, 2006

Related U.S. Application Data

(63) Continuation of application No. 10/603,242, filed on Jun. 24, 2003, now Pat. No. 6,933,193.

(51) Int. Cl.
*H01L 21/20* (2006.01)
*H01L 21/461* (2006.01)

(52) U.S. Cl. ............... 438/393; 438/238; 257/E21.019; 257/E27.048

(58) Field of Classification Search ......... 438/238, 438/393; 257/E27.048, E21.019
See application file for complete search history.

(56) References Cited

U.S. PATENT DOCUMENTS

| | | | |
|---|---|---|---|
| 4,464,223 A | 8/1984 | Gorin | |
| 4,577,395 A | 3/1986 | Shibata | |
| 5,153,685 A | 10/1992 | Murata et al. | |
| 5,280,215 A * | 1/1994 | Ohtake et al. | 313/403 |
| 5,354,711 A | 10/1994 | Heitzmann et al. | |
| 5,413,898 A | 5/1995 | Kim et al. | |
| 5,523,258 A | 6/1996 | Petti et al. | |
| 5,525,534 A | 6/1996 | Ikemasu et al. | |
| 5,552,334 A | 9/1996 | Tseng | |
| 5,591,061 A * | 1/1997 | Ikeda et al. | 445/3 |
| 5,702,989 A | 12/1997 | Wang et al. | |
| 5,942,446 A | 8/1999 | Chen et al. | |
| 5,963,814 A | 10/1999 | Walker et al. | |
| 6,037,213 A * | 3/2000 | Shih et al. | 438/253 |

(Continued)

FOREIGN PATENT DOCUMENTS

DE  4235702 A1  4/1994

(Continued)

*Primary Examiner*—Michael Lebentritt
*Assistant Examiner*—Thu-Huong Dinh
(74) *Attorney, Agent, or Firm*—Wells St. John P.S.

(57) ABSTRACT

A carbon containing masking layer is patterned to include a plurality of container openings therein having minimum feature dimensions of less than or equal to 0.20 micron. The container openings respectively have at least three peripheral corner areas which are each rounded. The container forming layer is plasma etched through the masking layer openings. In one implementation, such plasma etching uses conditions effective to both a) etch the masking layer to modify shape of the masking layer openings by at least reducing degree of roundness of the at least three corners in the masking layer, and b) form container openings in the container forming layer of the modified shapes. Capacitors comprising container shapes are formed using the container openings in the container forming layer. Other implementations and aspects are disclosed.

47 Claims, 10 Drawing Sheets

U.S. PATENT DOCUMENTS

| | | |
|---|---|---|
| 6,074,979 A | 6/2000 | Hagemeyer et al. |
| 6,080,531 A | 6/2000 | Carter et al. |
| 6,121,653 A | 9/2000 | Juengling |
| 6,190,989 B1 | 2/2001 | Roberts |
| 6,238,850 B1 | 5/2001 | Bula et al. |
| 6,248,508 B1 | 6/2001 | Murooka et al. |
| 6,397,377 B1 | 5/2002 | Wang et al. |
| 6,410,437 B1 | 6/2002 | Flanner et al. |
| 6,410,453 B1 | 6/2002 | Sandhu |
| 6,418,008 B1 | 7/2002 | Jost et al. |
| 6,455,439 B2 | 9/2002 | Sandhu |
| 6,475,921 B2 | 11/2002 | Sandhu |
| 6,479,391 B2 | 11/2002 | Morrow et al. |
| 6,528,238 B1 | 3/2003 | Seniuk et al. |
| 6,573,187 B1 | 6/2003 | Chen et al. |
| 6,576,943 B1 | 6/2003 | Ishii et al. |
| 6,624,085 B2 | 9/2003 | Sandhu |
| 6,649,469 B1 | 11/2003 | Wilson |
| 6,713,407 B1 | 3/2004 | Cheng et al. |
| 6,769,303 B1 | 8/2004 | Okojie |
| 6,911,372 B2 | 6/2005 | Son |
| 6,936,510 B2 | 8/2005 | Itabashi et al. |
| 6,949,460 B2 | 9/2005 | Wagganer et al. |
| 7,014,965 B2 | 3/2006 | Liao et al. |
| 7,071,058 B2 | 7/2006 | Roberts et al. |
| 7,096,548 B2 * | 8/2006 | Sakurai et al. .............. 29/25.41 |
| 7,153,778 B2 | 12/2006 | Busch et al. |
| 2003/0073288 A1 | 4/2003 | Pham et al. |
| 2004/0038541 A1 | 2/2004 | Baier |
| 2004/0090734 A1 | 5/2004 | Lian |
| 2004/0125538 A1 | 7/2004 | Carstensen |
| 2004/0155289 A1 | 8/2004 | Murata et al. |
| 2004/0206044 A1 * | 10/2004 | Kondo et al. .............. 52/782.1 |
| 2004/0219801 A1 | 11/2004 | Oswald et al. |
| 2005/0017321 A1 | 1/2005 | Haakarainen et al. |
| 2005/0106882 A1 | 5/2005 | Chao et al. |

FOREIGN PATENT DOCUMENTS

| | | |
|---|---|---|
| JP | 06232112 A | 8/1994 |

* cited by examiner

METHOD OF FORMING A CAPACITOR

RELATED PATENT DATA

This patent resulted from a continuation application of U.S. patent application Ser. No. 10/603,242 filed on Jun. 24, 2003, entitled "Method of Forming a Capacitor", naming Aaron R. Wilson as the inventor, and which issued as U.S. Pat. No. 6,933,193 on Aug. 23, 2005, the disclosure of which is incorporated by reference.

TECHNICAL FIELD

This invention relates to methods of forming capacitors.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors.

One type of capacitor structure forms at least one of the capacitor electrodes into a container-like shape. A suitable opening is formed within a container forming material, typically a dielectric layer although bulk and other substrate materials can be used. A conductive layer is formed within the openings to partially fill them to form upwardly open vessel-like structures. The conductive material is then patterned or planarized back, typically to form isolated capacitor electrodes for the capacitors being formed. Some or all of the container forming layer might then be etched from the substrate to expose outer sidewalls of the container-shaped electrodes. One or more suitable capacitor dielectric layers would then be formed over the container-shaped electrode. Another conductive layer is then formed over the capacitor dielectric layer(s) and patterned or otherwise processed to complete the capacitor construction.

As minimum feature dimensions get smaller and smaller, the thickness or vertical length/height of devices tends to increase, and does so particularly with capacitors in order to maintain adequate surface area and accordingly desired capacitance.

SUMMARY OF THE INVENTION

The invention includes methods of forming capacitors. In one implementation, a method of forming a capacitor includes depositing a container forming layer over a substrate. A carbon containing masking layer is deposited over the container forming layer. The carbon containing masking layer is patterned to comprise a plurality of container openings therein having minimum feature dimensions of less than or equal to 0.20 micron. The container openings respectively have at least three peripheral corner areas which are each rounded. The container forming layer is plasma etched through the masking layer openings. In one implementation, such plasma etching uses conditions effective to both a) etch the masking layer to modify shape of the masking layer openings by at least reducing degree of roundness of the at least three corners in the masking layer, and b) form container openings in the container forming layer of the modified shapes. In one implementation, the respective container openings in the masking layer include a plurality of straight line segments at least 2 nanometers long. The container forming layer is plasma etched through the masking layer openings using conditions effective to both a) etch the masking layer to modify shape of the masking layer openings to increase the number of straight line segments at least 2 nanometers long, and b) form container openings in the container forming layer of the modified shapes. In one implementation, the carbon containing masking layer is patterned to comprise a plurality of circular shaped container openings therein having minimum diameter of less than or equal to 0.20 micron. The container forming layer is plasma etched through the masking layer openings using conditions effective to both a) etch the masking layer to modify shape of the masking layer openings from circular to having at least four straight line segments of at least 2 nanometers long, and b) form container openings in the container forming layer of the modified shapes. Capacitors comprising the container shapes are formed using the container openings in the container forming layer.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
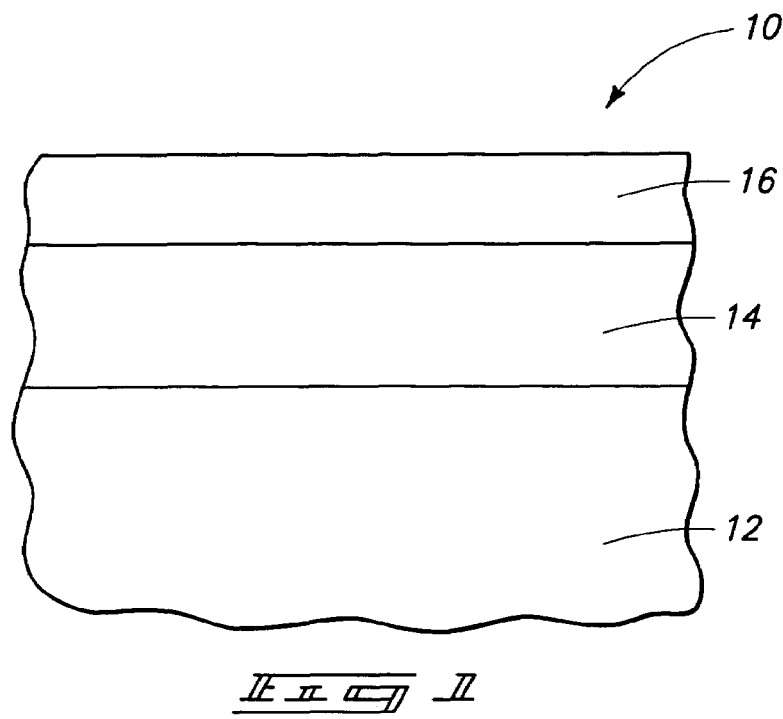
FIG. 1 is a diagrammatic sectional view of an exemplary substrate fragment at a processing step in accordance with an aspect of the invention.

Preferred embodiment methods of forming capacitors are described with reference to FIGS. 1-18. Referring initially to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

Substrate 10 comprises an exemplary bulk substrate material 12, for example monocrystalline silicon. Of course, other materials and substrates are contemplated, including semiconductor-on-insulator and other substrates whether existing or yet-to-be developed. A container forming layer 14 is formed over substrate 12. An exemplary preferred material is an insulative material, such as borophosphosilicate glass (BPSG). An exemplary deposition thickness range is from 10,000 Angstroms to 30,000 Angstroms. A carbon containing masking layer 16 is deposited over container forming layer 14. Exemplary preferred materials include amorphous carbon and photoresists, for example 248 nm and 193 nm photoresists. Of course, multilayer or other masking layer processings are also contemplated, such as multilayer resist processing. An exemplary thickness for layer 16 is from 1,000 Angstroms to 10,000 Angstroms.

Figure 2:
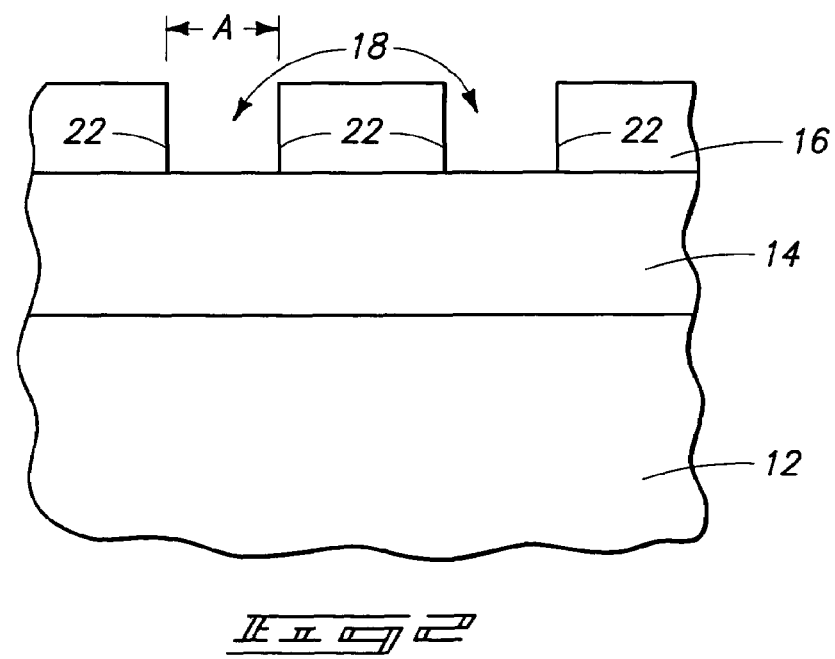
FIG. 2 is a view of the FIG. 1 substrate at a processing step subsequent to that shown by FIG. 1.
Figure 3:
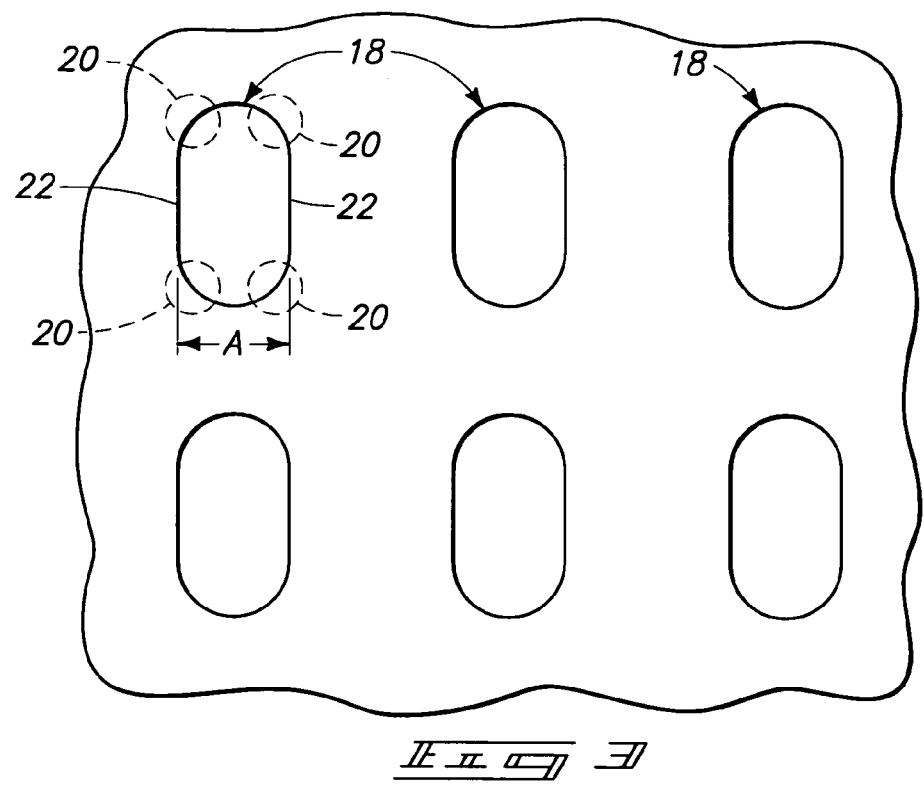
FIG. 3 is an expanded top plan view of the FIG. 2 substrate.

Referring to FIGS. 2 and 3, carbon containing masking layer 16 has been patterned to comprise a plurality of container openings 18 having minimum feature dimensions "A" of less than or equal to 0.20 micron, more preferably less than or equal to 0.15 micron, and even more preferably less than or equal to 0.10 micron. Any form of patterning is contemplated, whether existing or yet-to-be-developed, with photolithography and solvent etch being but one preferred example. All of the container openings are depicted as having the same general size and shape, although differing sizes and shapes are also of course contemplated. In the FIGS. 2 and 3 illustrated preferred embodiment, container openings 18 have a generally race track shape. Further additionally and alternately considered, container openings 18 can be considered as having peripheral corner areas 20 which are each perceptibly rounded. In one aspect of the invention, the container openings can be considered as having at least three peripheral corner areas which are rounded, with four being shown in the exemplary FIG. 3 embodiment. In yet a further and alternate consideration, container openings 18 can be considered as having a plurality of straight line segments 22 which are each at least two nanometers long, with only two such segments being shown in the exemplary FIG. 3 embodiment.

Figure 5:
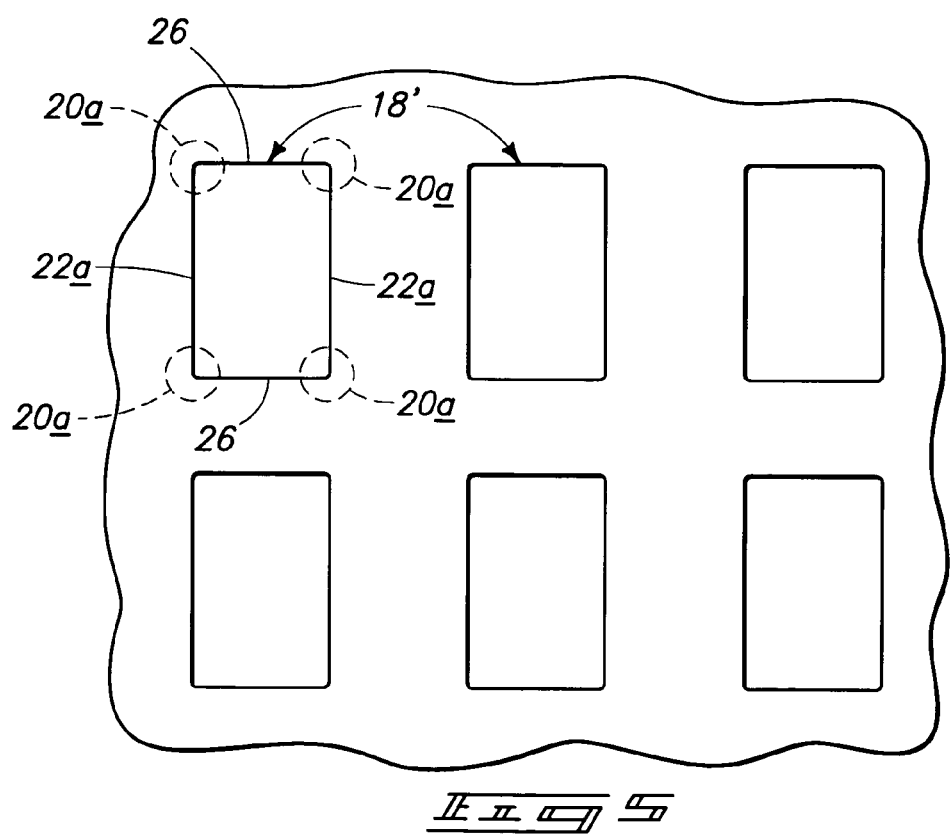
FIG. 5 is an enlarged top plan view of the FIG. 4 substrate.
Figure 4:
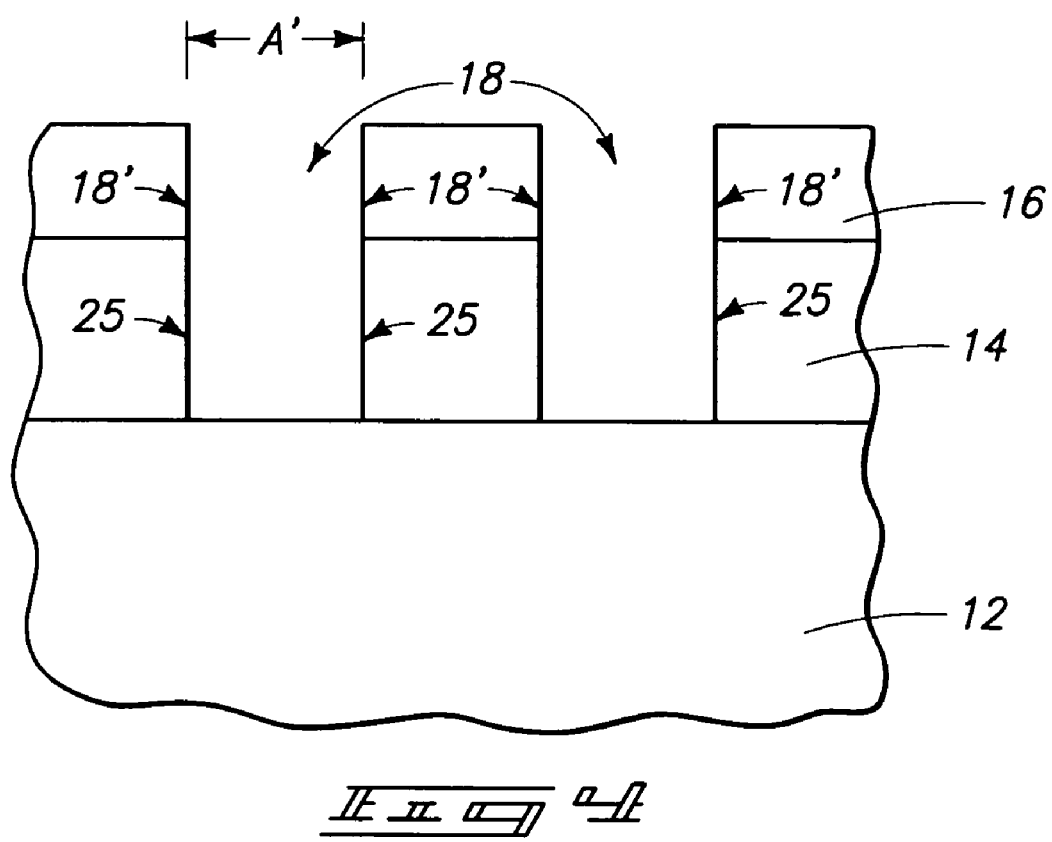
FIG. 4 is a view of the FIG. 2 substrate at a processing step subsequent to that shown by FIG. 2.

Referring to FIGS. 4 and 5, container forming layer 14 is etched through masking layer openings 18 effective to both modify the shape of the masking layer openings to a shape 18' and form container openings 25 in container forming layer 14 of the modified shapes. In one considered implementation, conditions are used which are effective to modify the shape of the masking layer openings by at least reducing the degree of roundness of the at least three corners in the masking layer, for example producing corner regions 20a. In accordance with one preferred implementation, for example as depicted in the FIGS. 3 and 5 embodiment, the etching conditions are effective to reduce the degree of roundness effective to perceptibly square the corner regions when viewed at a magnification level having a field of view in which all of a single container opening is viewable, and in one implementation, to modify the generally race track shaped container openings into rectangles.

Further in one considered alternate or additional implementation, the etching of the container forming layer through the masking layer openings is conducted using conditions effective to modify the masking layer openings to increase the number of straight line segments which are each at least two nanometers long. For example, FIG. 5 depicts four straight line segments 22a/26/22a/26 for the respective container openings in the carbon containing masking layer and the container forming layer. Further in one considered implementation, FIG. 5 depicts the etching modifying the shape of the masking layer openings to include at least four straight line segments of at least two nanometers long, with the at least four straight line segments having a total added length which is more than 50% of the perimeter of the respective modified shapes. In such further preferred implementations, the total added length of such segments is more than 60% in one embodiment, more than 70% in one embodiment, more than 80% in one embodiment, and more than 90% in one embodiment of the perimeter of the respective modified shapes. In one reduction to practice example, the lengths of individual segments 22a and 26 were as 0.3 micron and 0.15 micron respectively, providing a perimeter of about 0.9 micron.

The inventions were reduced-to-practice in a capacitively coupled, dual-frequency plasma etcher. However, the invention is anticipated to be practicable in other plasma etchers, whether capacitively coupled or having one or multiple frequencies. Further and regardless, by way of example only, the preferred conditions when plasma etching utilize a total applied power to the plasma generating electrodes of at least 7 W/cm2 of substrate area being processed, and more preferably at least 10 W/cm2 of substrate area being processed. Further by way of example only, the preferred plasma etching uses a chuck and substrate temperature of at least 40□C. An exemplary preferred etching chemistry includes fluorocarbons, such as one or both of C4F6 and C4F8.

One preferred set of exemplary plasma etching conditions utilizes multiple frequencies which are applied to the wafer chuck within the chamber upon which the substrate rests during etching. An existing exemplary such reactor is the LAM Research 2300 Excelan Oxide Etching Tool. By way of example only, alternate preferred conditions include etching whereby one frequency is applied to a wafer chuck upon which the substrate rests during etching, and yet another frequency is applied to an electrode which is spaced from the substrate. An exemplary existing such etcher is the Applied Materials Producer Etch Tool.

Figure 6:
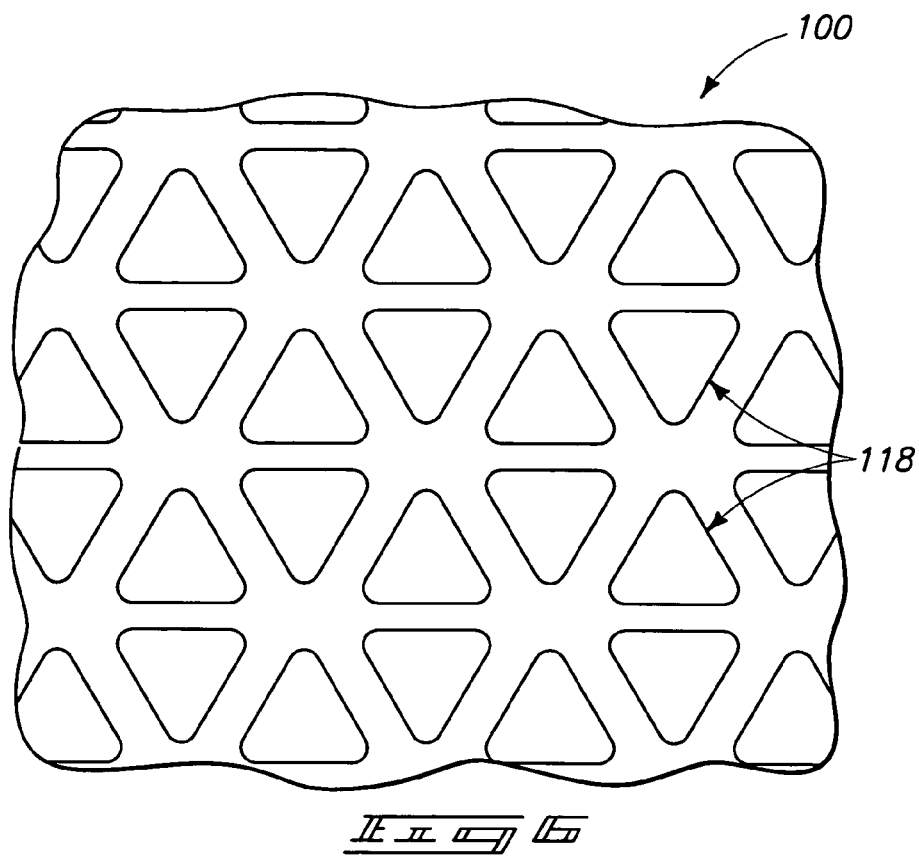
FIGS. 6 and 7, respectively, are top plan views of an alternate substrate corresponding in processing sequence to that depicted by FIGS. 3 and 5, respectively, in accordance with an aspect of the invention.
Figure 7:
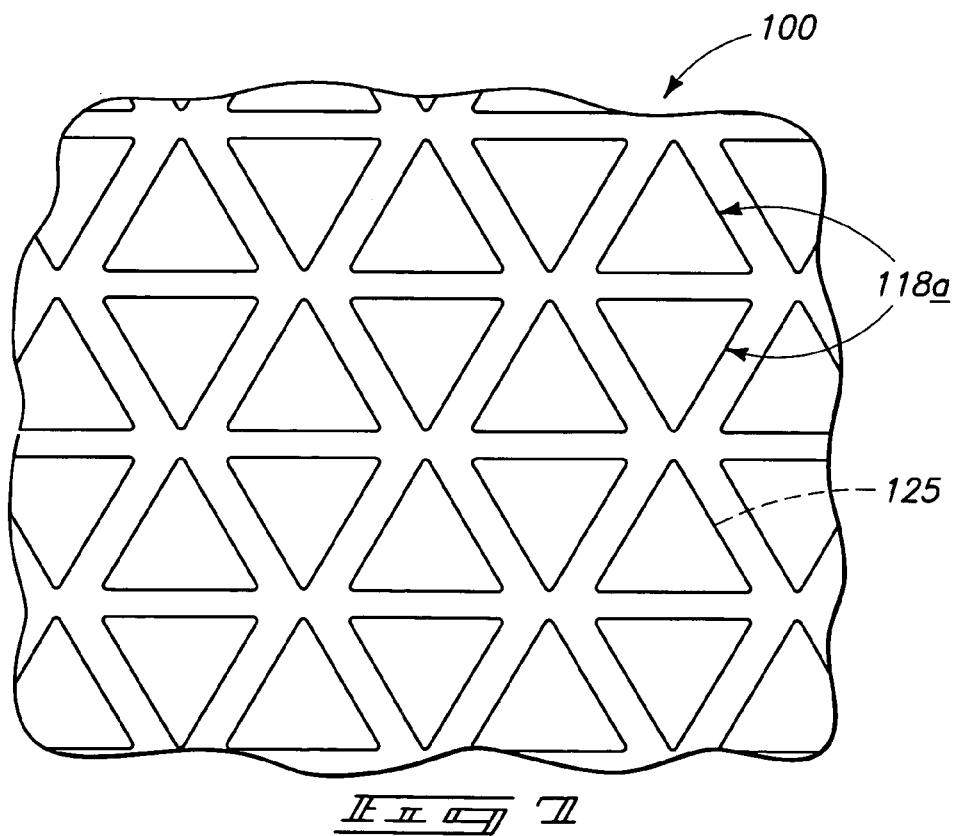
Figure 8:
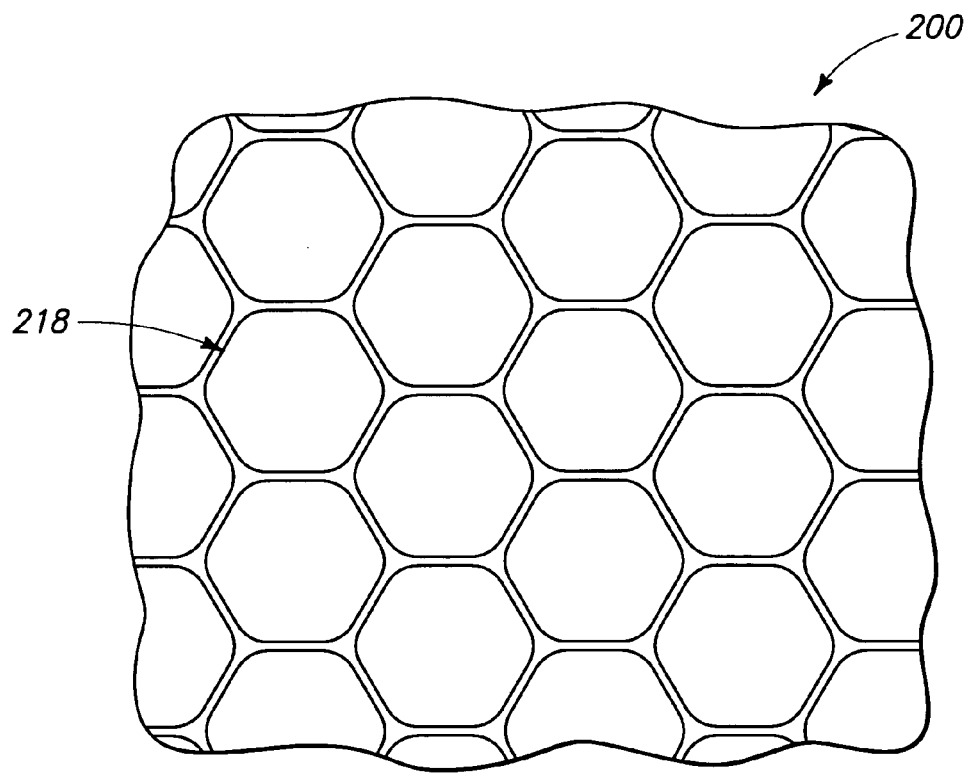
FIGS. 8 and 9, respectively, are top plan views of another alternate substrate corresponding in processing sequence to that depicted by FIGS. 3 and 5, respectively, in accordance with an aspect of the invention.
Figure 9:
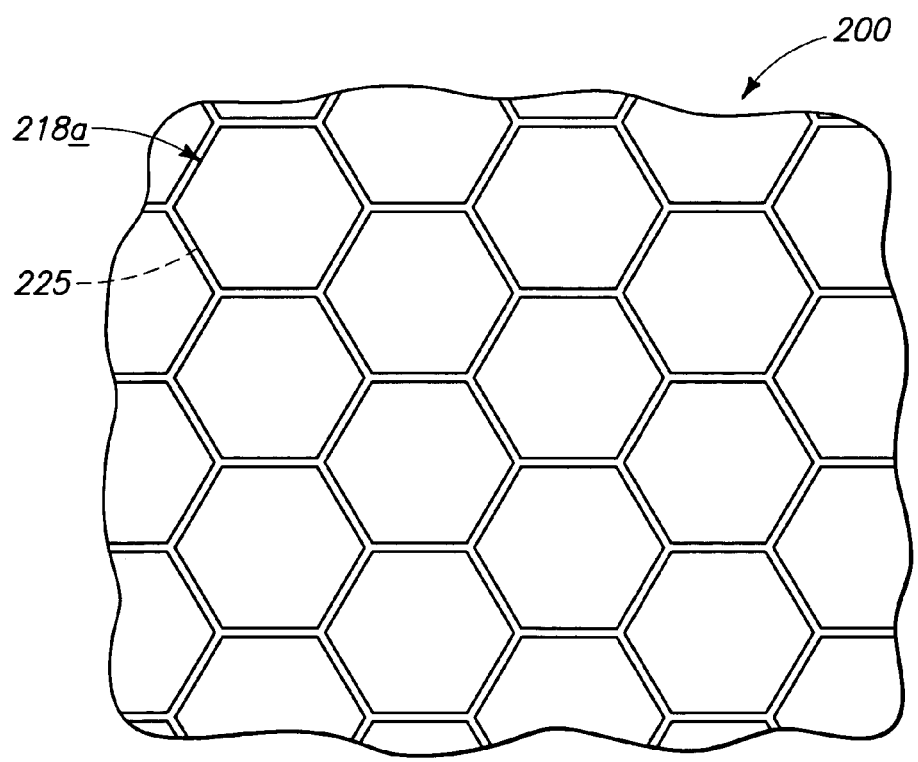
Figure 10:
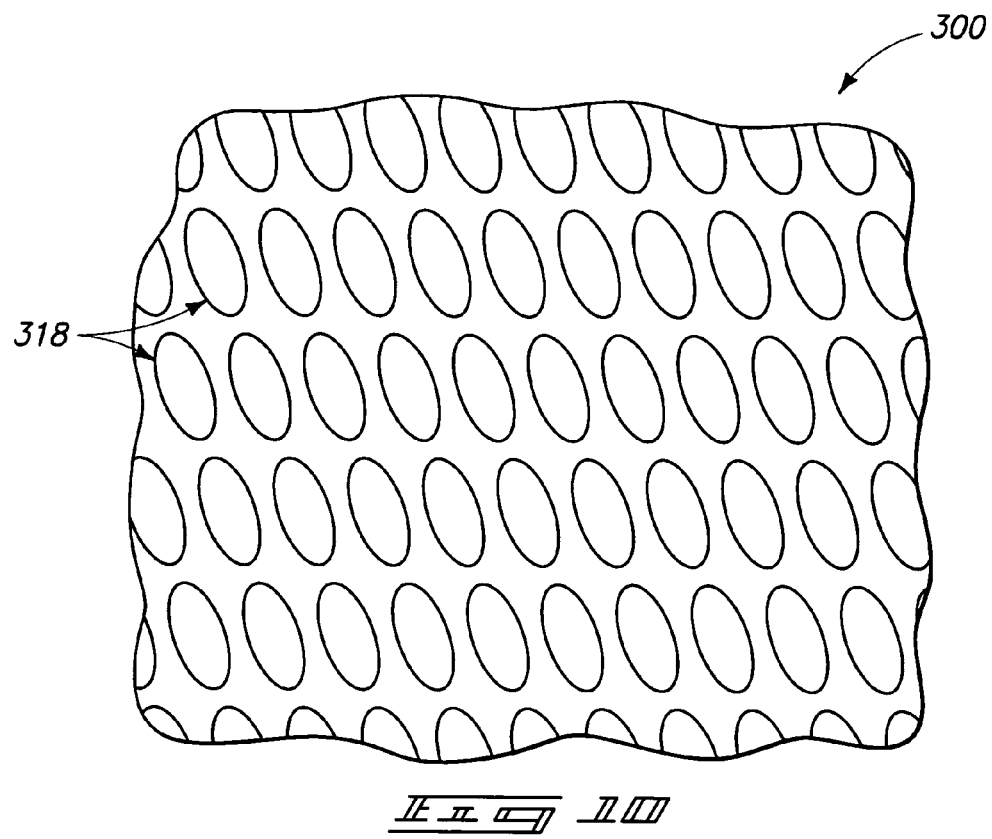
FIGS. 10 and 11, respectively, are top plan views of still another alternate substrate corresponding in processing sequence to that depicted by FIGS. 3 and 5, respectively, in accordance with an aspect of the invention.
Figure 11:
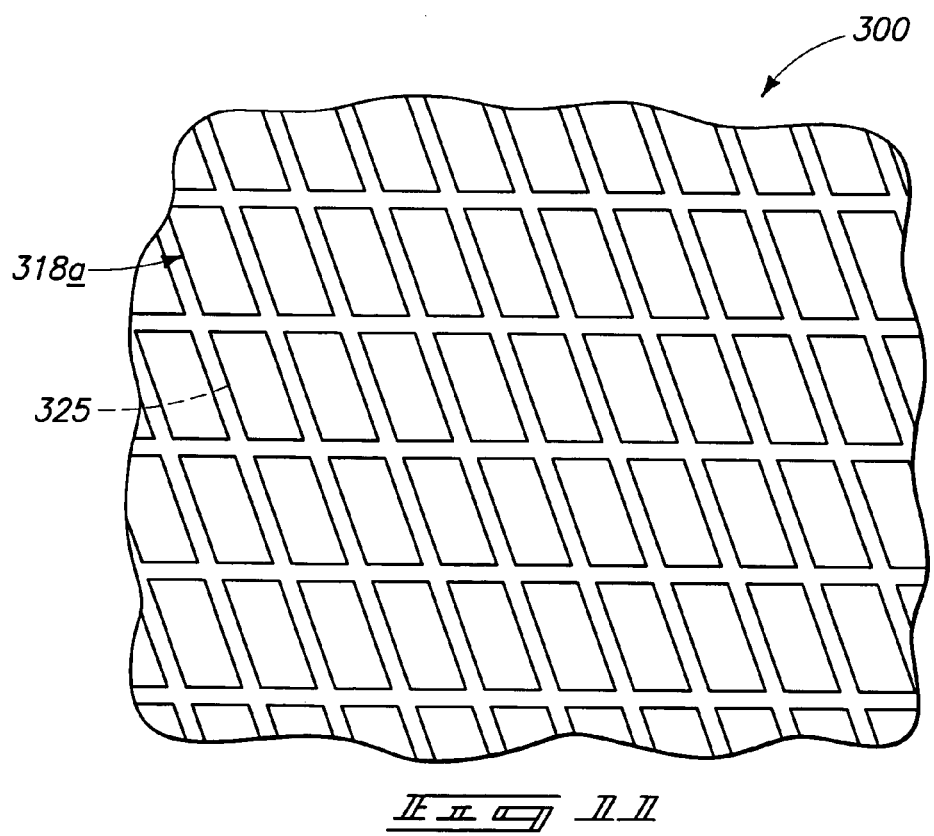

Aspects of the invention are expected to have applicability to other than race track shapes, or in producing other than four-sided openings therefrom. By way of example only, some alternate exemplary embodiments are shown with reference to FIGS. 6-15. For example, FIG. 6 depicts a wafer fragment 100 having regular, three-sided container shapes 118 having rounded corner regions. The roundness thereof is appreciably/perceptibly reduced (FIG. 7) by the etching in producing container openings 118a in the masking layer and container openings 125 in the container opening forming layer. In a similar manner with respect to exemplary regular, six-sided structures, FIGS. 8 and 9 illustrate container openings 218 in the carbon containing masking layer being transformed to openings 218a and container openings 225 in the capacitor forming layer. Non-regular shapes are also of course contemplated. FIGS. 10 and 11 depict slanted container openings 318 in the carbon containing masking layer being transformed to openings 318a and container openings 325 in the capacitor forming layer.

Figure 12:
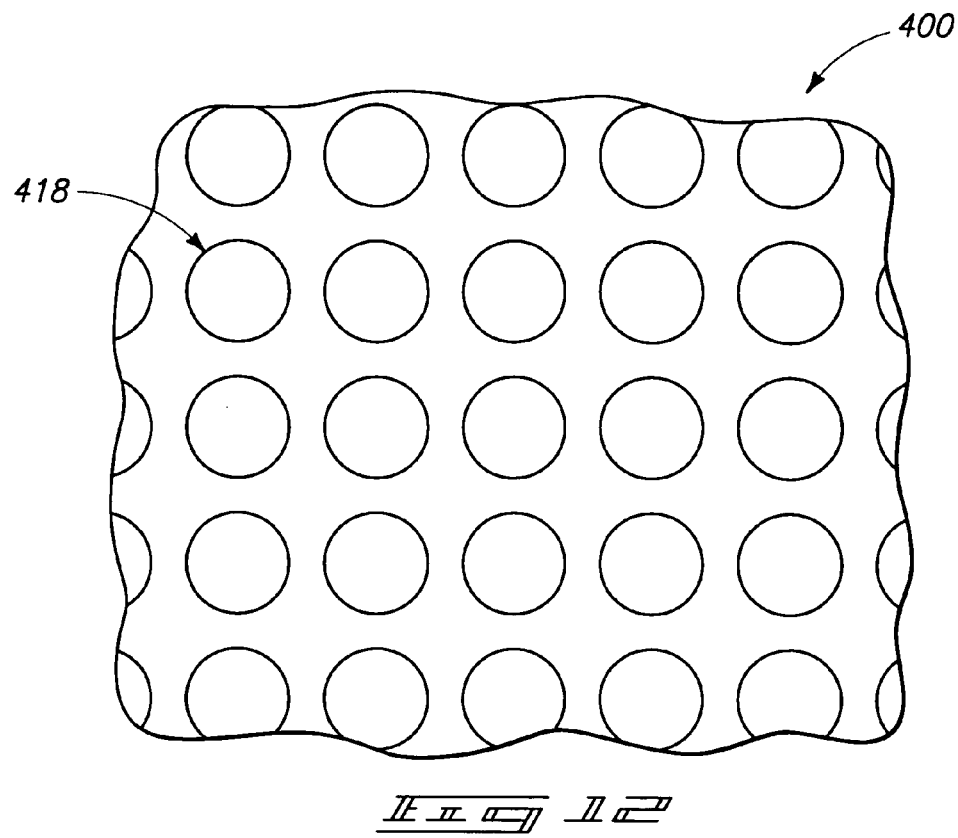
FIGS. 12 and 13, respectively, are top plan views of yet another alternate substrate corresponding in processing sequence to that depicted by FIGS. 3 and 5, respectively, in accordance with an aspect of the invention.
Figure 13:
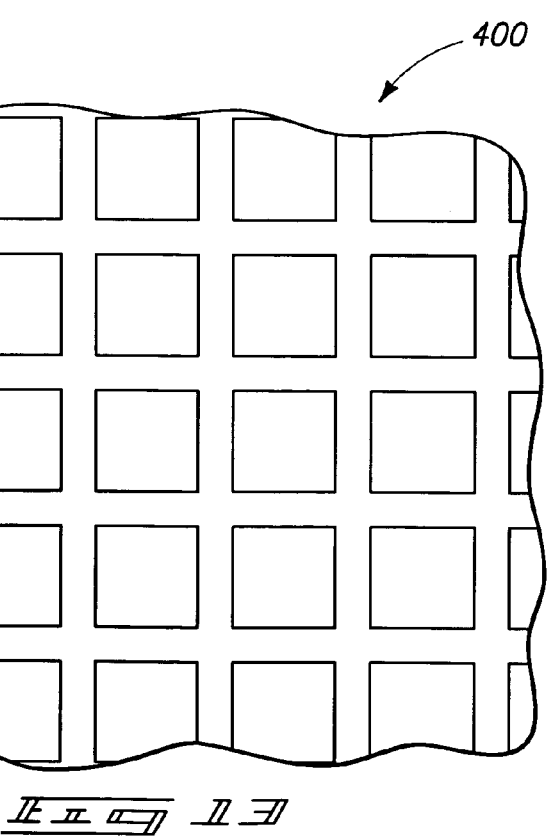
Figure 14:
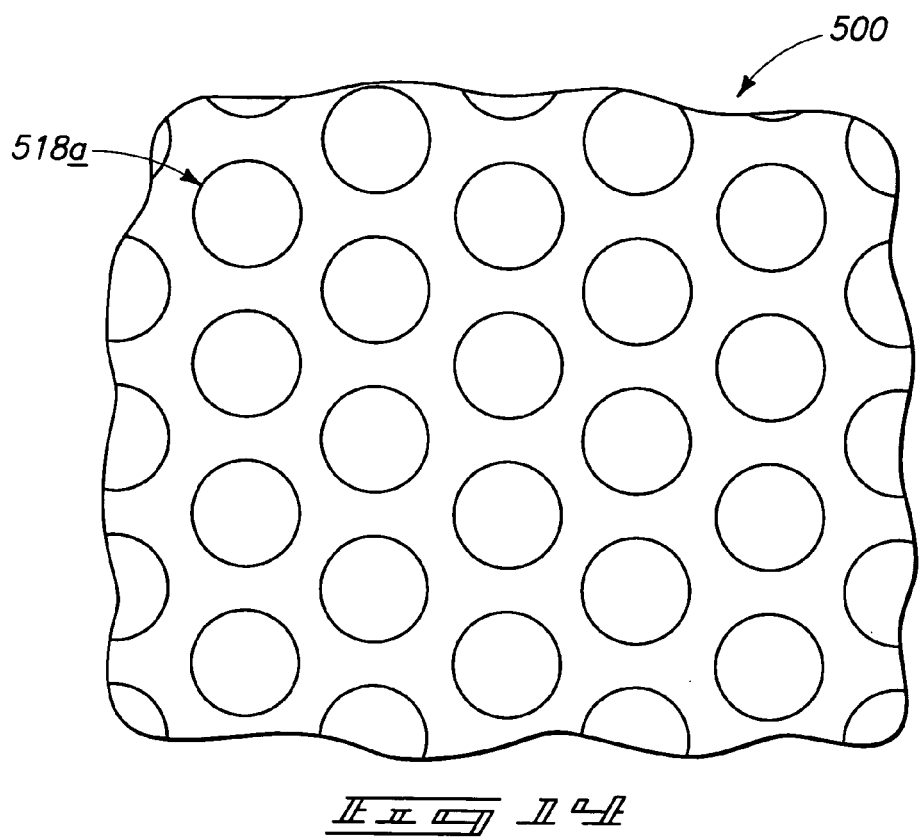
FIGS. 14 and 15, respectively, are top plan views of still yet another alternate substrate corresponding in processing sequence to that depicted by FIGS. 3 and 5, respectively, in accordance with an aspect of the invention.
Figure 15:
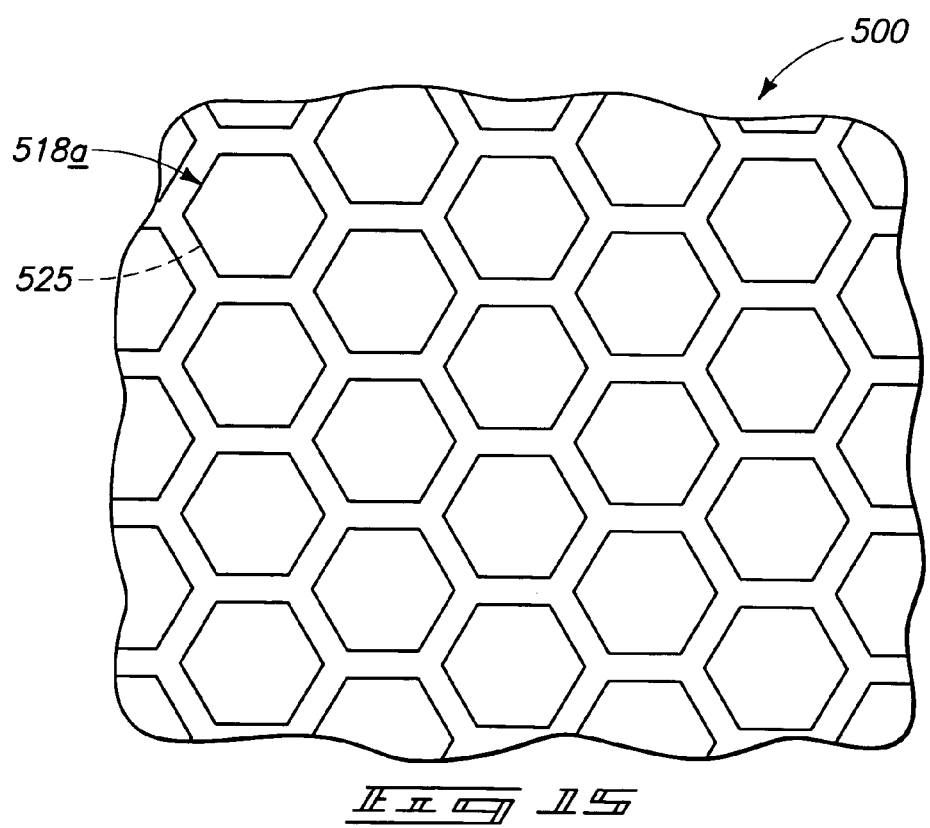

Further by way of example only, the invention contemplates patterning the carbon containing masking layer to comprise a plurality of circular shaped container openings therein having minimum diameter of less than or equal to 0.20 micron. The container forming layer is plasma etched through the masking layer openings using conditions effective to both a) etch the masking layer to modify shape of the masking layer openings from circular to having at least four straight line segments of at least 2 nanometers long, and b) form container openings in the container forming layer of the modified shapes. For example, FIGS. 12 and 13 depict an array of circular container openings 418 in the carbon containing masking layer being transformed to four-sided/square openings 418a and container openings 325 in the capacitor forming layer. Further by way of example only, FIGS. 14 and 15 depict an array of circular container openings 518 in the carbon containing masking layer being transformed to hexagonal openings 518a and container openings 525 in the capacitor forming layer.

Other implementations are also of course contemplated, with the invention only being limited by the accompanying claims. Further by way of example only, the various exemplary and other shaped container openings might be mixed such that all are not uniform across the substrate, and might be fabricated with container openings, or other openings on the substrate, not falling within the context of the above-described invention.

Figure 16:
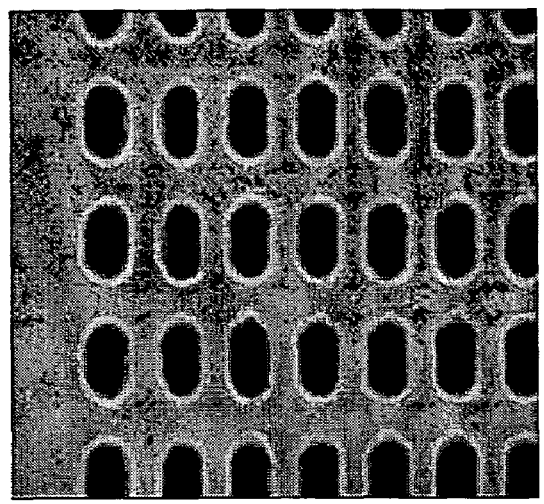
FIGS. 16 and 17, respectively, are top plan view scanning electron micrographs of a reduction-to-practice example corresponding in processing sequence to that depicted by FIGS. 3 and 5, respectively, in accordance with an aspect of the invention.
Figure 17:
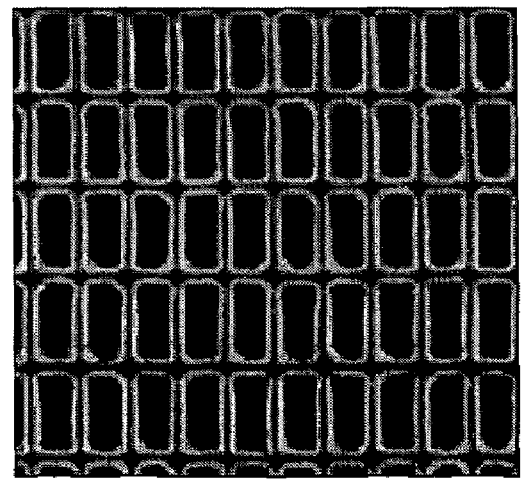

Exemplary reduction-to-practice examples are shown by scanning electron micrograph in FIGS. 16 and 17 provided herein. Such processing was conducted in a LAM Research 2300 Excelan Oxide Etch Tool on 200 mm substrates having a container forming layer of BPSG 20,000 Angstroms thick, and a CVD amorphous carbon layer formed thereover which was 3,000 Angstroms thick. The minimum feature dimension across the illustrated container openings in FIG. 16 were 0.11 micron. The etching conditions utilized in the LAM 2300 etching chamber to produce the FIG. 11 construction included 50 mTorr, top plate temperature of 190□C., chuck/bottom electrode temperature 60□C, backside helium pressure 12 Torr, power at both 1200 W at 27 MHz and 1800 W at 2 MHz to the bottom electrode, 270 sccm Ar, 24 sccm of mixed He and O2 (33% by volume O2) 7 sccm C4F6 and 5 sccm C4F8.

Figure 18:
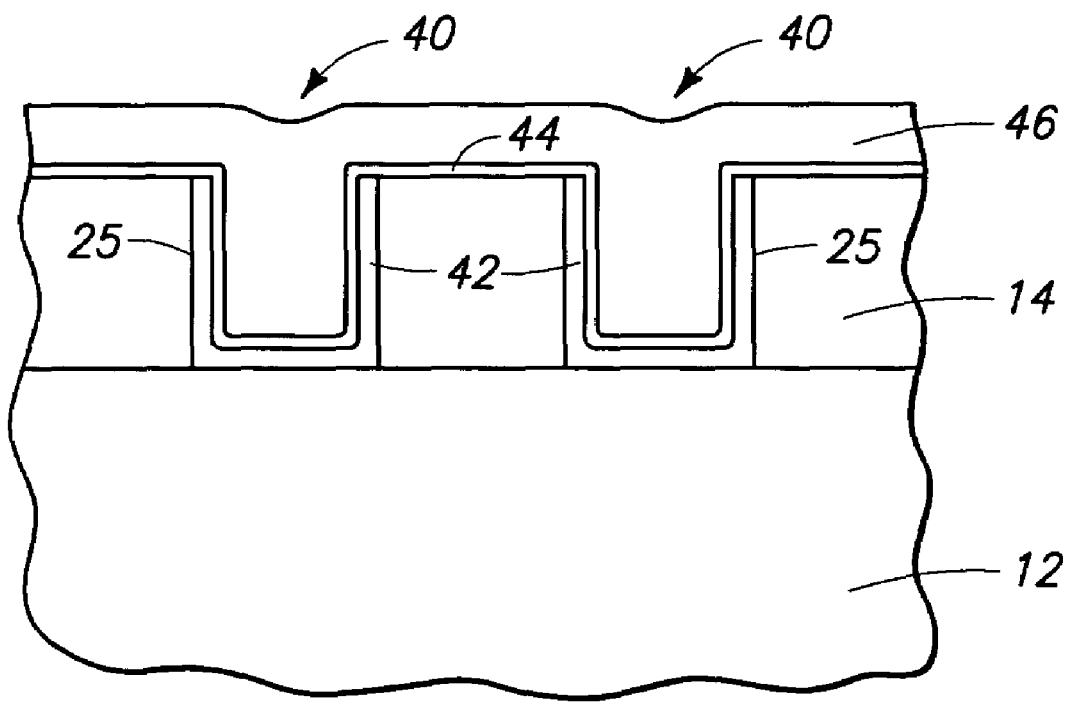
FIG. 18 is a view of the FIG. 4 wafer fragment at a processing step subsequent to that shown by FIG. 4.

Referring to FIG. 18, exemplary capacitors 40 are shown as having been fabricated which comprise container shapes using container openings 25 formed in container forming layer 14. By way of example only, such are shown as being comprised of respective storage nodes 42, capacitor dielectric layer 44 and a common outer electrode layer 46. Of course, alternate shapes and configuration capacitors are contemplated, and capacitor forming layer 14 might remain completely on the substrate as shown, or be partially or completely removed therefrom. In one preferred implementation, the capacitor is fabricated as part of DRAM circuitry, for example as shown in FIG. 18. Alternately of course, the method has applicability in the fabrication of capacitors used in any kind of circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a capacitor, comprising:
   depositing a layer over a semiconductor substrate;
   depositing a carbon-containing mask over the layer;
   patterning the mask to comprise a plurality of mask openings therein respectively having a minimum feature dimension of no greater than 0.20 micron, the mask openings respectively having at least three peripheral corner regions which are each rounded;
   plasma etching the layer through the mask openings using conditions effective to both a) etch the mask to modify the shape of the mask openings by at least reducing the degree of roundness of the at least three corner regions in the mask, and b) form openings in the layer; and
   forming container shaped capacitor electrodes within the openings in the layer.

2. The method of claim 1 wherein the etching is effective to reduce the degree of roundness effective to square said corner regions when viewed at a magnification level having a field of view in which all of a single mask opening is viewable.

3. The method of claim 1 wherein the mask openings have at least four peripheral corner regions, and all of which have reduced degree of roundness from the etching.

4. The method of claim 1 wherein the mask openings have only four peripheral corner regions, and all of which have reduced degree of roundness from the etching.

5. The method of claim 1 wherein the mask openings have only three peripheral corner regions, and all of which have reduced degree of roundness from the etching.

6. The method of claim wherein the mask openings have at least six peripheral corner regions, and all of which have reduced degree of roundness from the etching.

7. The method of claim 1 wherein the mask comprises photoresist.

8. The method of claim 1 wherein the mask comprises amorphous carbon.

9. The method of claim 1 wherein the patterning comprises photolithography and solvent etch.

10. The method of claim 1 wherein the mask openings are patterned to have minimum feature dimensions of less than 0.15 micron.

11. The method of claim 1 wherein the mask openings are patterned to have minimum feature dimensions of less than 0.10 micron.

12. The method of claim 1 comprising fabricating the capacitor as part of DRAM circuitry.

13. The method of claim 1 wherein the conditions comprise plasma etching using a total applied power of at least 7 W/cm$^2$ of substrate area being processed.

14. The method of claim 1 wherein the conditions comprise plasma etching using a total applied power of at least 10 W/cm$^2$ of substrate area being processed.

15. The method of claim 1 wherein the conditions comprise plasma etching in a capacitively coupled, multi frequency plasma etcher.

16. The method of claim 5 wherein multiple frequencies are applied to a wafer chuck upon which the substrate rests during etching.

17. The method of claim 16 wherein the plasma etching uses a total applied power of at least 7 W/cm$^2$ of substrate area being processed to the wafer chuck, uses a substrate temperature of at least 40° C., and a fluorocarbon comprising etching chemistry.

18. A method of forming a capacitor, comprising:
depositing a layer over a semiconductor substrate;
depositing a carbon-containing mask over the layer;
patterning the mask to comprise a plurality of generally racetrack shaped mask openings therein respectively having a minimum feature dimension of no greater than 0.20 micron;
plasma etching the layer through the mask openings using conditions effective to both a) etch the mask to modify the shape of the mask openings into rectangles, and b) form openings in the layer; and
forming container shaped capacitors electrodes within the openings in the layer.

19. The method of claim 18 wherein the mask comprises photoresist.

20. The method of claim 18 wherein the mask comprises amorphous carbon.

21. The method of claim 18 wherein the mask openings are patterned to have minimum feature dimensions of less than 0.15 micron.

22. The method of claim 18 wherein the mask openings are patterned to have minimum feature dimensions of less than 0.10 micron.

23. The method of claim 18 comprising fabricating the capacitor as part of DRAM circuitry.

24. The method of claim 18 wherein the conditions comprise plasma etching using a total applied power of at least 7 W/cm$^2$ of substrate area being processed.

25. The method of claim 18 wherein the conditions comprise plasma etching using a total applied power of at least 10 W/cm$^2$ of substrate area being processed.

26. The method of claim 18 wherein the conditions comprise plasma etching using a total applied power of at least 7 W/cm$^2$ of substrate area being processed, using a substrate temperature of at least 40° C., and a fluorocarbon-comprising etching chemistry.

27. The method of claim 18 wherein the conditions comprise plasma etching in a capacitively coupled, multi frequency plasma etcher.

28. A method of forming a capacitor, comprising:
depositing a layer over a semiconductor substrate;
depositing a carbon-containing mask over the layer;
patterning the mask to comprise a plurality of mask openings therein respectively having a minimum feature dimension of no greater than 0.20 micron, the respective mask openings including a plurality of straight line segments at least 2 nanometers long;
plasma etching the layer through the mask openings using conditions effective to both a) etch the mask to modify the shape of the mask openings to increase the number of straight line segments at least 2 nanometers long, and b) form openings in the layer; and
forming container shaped capacitors electrodes within the openings in the layer.

29. The method of claim 28 wherein the conditions comprise plasma etching using a total applied power of at least 7 W/cm$^2$ of substrate area being processed.

30. The method of claim 28 wherein the conditions comprise plasma etching using a total applied power of at least 10 W/cm$^2$ of substrate area being processed.

31. The method of claim 28 wherein the conditions comprise plasma etching using a total applied power of at least 7 W/cm$^2$ of substrate area being processed, using a substrate temperature of at least 40° C., and a fluorocarbon-comprising etching chemistry.

32. The method of claim 28 wherein the conditions comprise plasma etching in a capacitively coupled, multi frequency plasma etcher.

33. The method of claim 32 wherein multiple frequencies are applied to a wafer chuck upon which the substrate rests during etching.

34. The method of claim 33 wherein the plasma etching uses a total applied power of at least 7 W/cm$^2$ of substrate area being processed to the wafer chuck, uses a substrate temperature of at least 40° C., and a fluorocarbon-comprising etching chemistry.

35. The method of claim 32 wherein one frequency is applied to a wafer chuck upon which the substrate rests during etching and another frequency is applied to an electrode spaced from the substrate.

36. A method of forming a capacitor, comprising:
depositing a layer over a semiconductor substrate;
depositing a carbon-containing mask over the layer;
patterning the mask to comprise a plurality of mask openings therein respectively having a minimum feature dimension of no greater than 0.20 micron, the mask openings respectively having no more than two straight line segments at least 2 nanometers long;
plasma etching the layer through the mask openings using conditions effective to both a) etch the mask to modify the shape of the mask openings to include at least four straight line segments at least 2 nanometers long, the at least four straight line segments having total added length which is more than 50% of the perimeter of the respective modified shapes, and b) form openings in the layer; and
forming container shaped capacitor electrodes within the openings in the layer.

37. The method of claim 36 wherein said total added length is more than 60% of the perimeter of the respective modified shapes.

38. The method of claim 36 wherein said total added length is more than 70% of the perimeter of the respective modified shapes.

39. The method of claim 36 wherein said total added length is more than 80% of the perimeter of the respective modified shapes.

40. The method of claim 36 wherein said total added length is more than 90% of the perimeter of the respective modified shapes.

41. The method of claim 36 wherein the modified shapes have said straight line segments numbering only four.

42. The method of claim 36 wherein the conditions comprise plasma etching using a total applied power of at least 7 W/cm$^2$ of substrate area being processed.

43. The method of claim 36 wherein the conditions comprise plasma etching using a total applied power of at least 10 W/cm$^2$ of substrate area being processed.

44. The method of claim 36 wherein the conditions comprise plasma etching using a total applied power of at least 7 W/cm$^2$ of substrate area being processed, using a substrate temperature of at least 40° C., and a fluorocarbon-comprising etching chemistry.

45. The method of claim 36 wherein the conditions comprise plasma etching in a capacitively coupled, multi frequency plasma etcher.

46. The method of claim 45 wherein multiple frequencies are applied to a water chuck upon which the substrate rests during etching, the plasma etching uses a total applied power of at least 7 W/cm$^2$ of substrate area being processed to the wafer chuck, uses a substrate temperature of at least 40° C., and a fluorocarbon-comprising etching chemistry.

47. The method of claim 45 wherein one frequency is applied& to a wafer chuck upon which the substrate rests during etching and another frequency is applied to an electrode spaced from the substrate.

* * * * *

UNITED STATES PATENT AND TRADEMARK OFFICE
CERTIFICATE OF CORRECTION

PATENT NO. : 7,358,146 B2 Page 1 of 1
APPLICATION NO. : 11/209082
DATED : April 15, 2008
INVENTOR(S) : Wilson It is certified that error appears in the above-identified patent and that said Letters Patent is hereby corrected as shown below:

In column 6, line 45, in Claim 6, after "claim" insert -- 1 --.

In column 7, line 4, in Claim 16, delete "claim 5" and insert -- claim 15 --, therefor.

In column 9, line 7, in Claim 46, delete "water" and insert -- wafer --, therefor.

In column 10, line 4, in Claim 47, delete "applied&" and insert -- applied --, therefor.

Signed and Sealed this

First Day of July, 2008

JON W. DUDAS
*Director of the United States Patent and Trademark Office*